United States Patent
Clinton et al.

(10) Patent No.: US 8,325,513 B2
(45) Date of Patent: *Dec. 4, 2012

(54) COMPOUND CELL SPIN-TORQUE MAGNETIC RANDOM ACCESS MEMORY

(75) Inventors: Thomas William Clinton, Pittsburgh, PA (US); Werner Scholz, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/349,036

(22) Filed: Jan. 12, 2012

(65) Prior Publication Data

US 2012/0106240 A1 May 3, 2012

Related U.S. Application Data

(60) Continuation of application No. 13/009,923, filed on Jan. 20, 2011, now Pat. No. 8,116,124, which is a division of application No. 11/950,925, filed on Dec. 5, 2007, now Pat. No. 7,898,849.

(51) Int. Cl.
*G11C 11/00* (2006.01)

(52) U.S. Cl. ..... 365/158; 365/148; 365/171; 365/225.5; 365/243.5; 977/935

(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 216/22; 257/421, E21.665; 438/3; 428/810–816, 817–825.1, 826; 977/933–935

See application file for complete search history.

(56) References Cited

U.S. PATENT DOCUMENTS

| | | | |
|---|---|---|---|
| 6,865,109 B2 | 3/2005 | Covington | |
| 7,006,375 B2 | 2/2006 | Covington | |
| 7,269,060 B2 | 9/2007 | Takizawa et al. | |
| 7,430,135 B2 * | 9/2008 | Huai et al. | 365/158 |
| 2007/0030728 A1 * | 2/2007 | Kent et al. | 365/171 |
| 2009/0273972 A1 * | 11/2009 | Han et al. | 365/173 |

OTHER PUBLICATIONS

Krivorotov et al., Reports "Time-Domain Measurements of Nonmagnet Dynamics Driven Spin-Transfer Torques", Jan. 14, 2005, vol. 309, Science, pp. 228-231. www.sciencemag.org.
Katine et al., "Current-driven magnetization reversal and spin-wave excitations in Co/Cu/Co Pillars", vol. 84, No. 14, Physical Review Letters 3, Apr. 2000, The American Physical Society, pp. 3149-3152.

* cited by examiner

*Primary Examiner* — Harry W Byrne
(74) *Attorney, Agent, or Firm* — Mueting Raasch & Gebhardt PA

(57) ABSTRACT

A compound magnetic data storage cell, applicable to spin-torque random access memory (ST-RAM), is disclosed. A magnetic data storage cell includes a magnetic storage element and two terminals communicatively connected to the magnetic storage element. The magnetic storage element is configured to yield any of at least three distinct magnetoresistance output levels, corresponding to stable magnetic configurations, in response to spin-momentum transfer inputs via the terminals.

16 Claims, 10 Drawing Sheets

COMPOUND CELL SPIN-TORQUE MAGNETIC RANDOM ACCESS MEMORY

RELATED APPLICATIONS

This application is continuation application of U.S. patent application Ser. No. 13/009,923 filed Jan. 20, 2011 and which is a divisional application of U.S. patent application Ser. No. 11/950,925, filed on Dec. 5, 2007. The entire disclosures of these applications are incorporated herein by reference.

BACKGROUND

Magnetic random access memory (MRAM) is a non-volatile solid-state data storage technology that has long shown promise, but has resisted achieving competitive levels of storage density after significant research investments. Typically, MRAM uses magnetic cells that each have two magnetic layers, where the two magnetic layers respond to write inputs by yielding either parallel or antiparallel magnetic polarities. A magnetic cell is in a lower magnetoresistive state, i.e. a state that yields a lower magnetoresistive output, when the two layers have parallel polarities, while the cell is in a higher magnetoresistive state when the two layers have antiparallel polarities. These two different magnetoresistive output levels yield different levels of magnetoresistance in response to a read input, so that the different levels of magnetoresistive output function as read signals, and each cell can encode one bit of information in terms of which of two different levels of magnetoresistive output it returns in response to a read signal. An array of such cells can encode large amounts of information, with the information storage density limited by factors such as the physical parameters of the 1-bit magnetic cells.

The present disclosure provides solutions to these and other problems and offers other advantages over the prior art. The discussion above is merely provided for general background information and is not intended to be used as an aid in determining the scope of the claimed subject matter.

SUMMARY

A compound magnetic data storage cell, applicable to spin-torque random access memory (ST-RAM), is disclosed. A magnetic data storage cell includes a magnetic storage element and two terminals communicatively connected to the magnetic storage element. The magnetic storage element is configured to yield any of at least three distinct magnetoresistance output levels, corresponding to stable magnetic configurations, in response to spin-momentum transfer inputs via the terminals.

DETAILED DESCRIPTION

Figure 1:
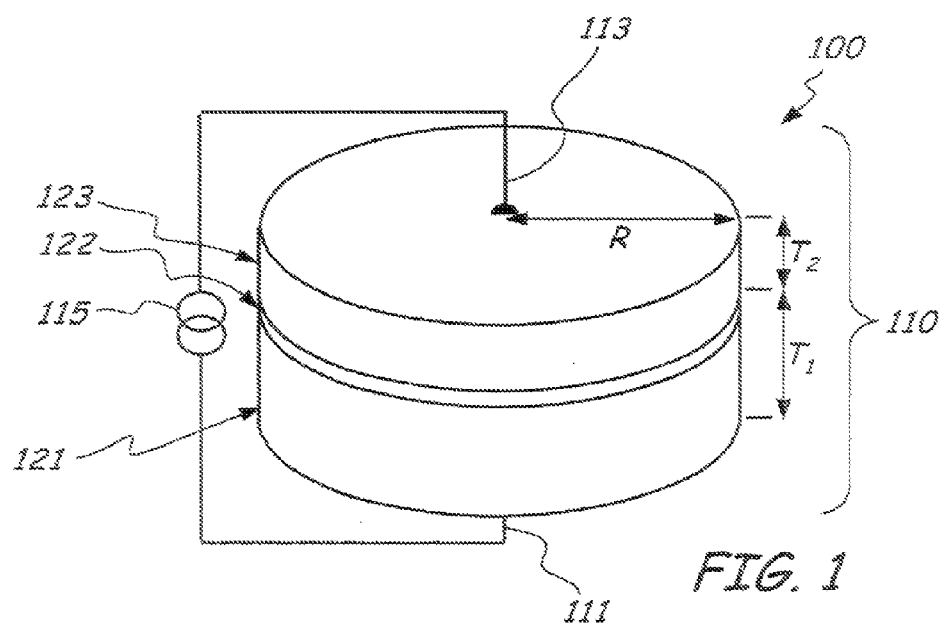
FIG. 1 depicts a perspective view of a compound magnetic data storage cell, comprising a magnetic data storage element and its corresponding terminals and node, in accordance with an illustrative example.

FIG. 1 depicts magnetic data storage cell 100, in accordance with an illustrative example. Several magnetic data storage cells such as magnetic data storage cell 100 may be included together in a data storage device or other data storage system, and configured for storing a very wide range of amounts of data. Magnetic data storage cell 100 is enabled to store more than one bit of data per storage cell, and may be referred to as a compound data storage cell. In contrast to simple data storage cells which are only able to encode one bit per cell, a compound data storage cell is capable of maintaining more than two stable states, and is therefore capable of encoding more than one bit of information per cell. The capability of encoding multiple bits per data storage cell, with comparable physical parameters per cell, means that magnetic data storage cell 100 is capable of dramatically increasing the storage density of ST-RAM, among other advantages.

Magnetic data storage cell 100 includes a magnetic data storage element 110 and first terminal 111 and second terminal 113 communicatively connected to the magnetic data storage element 110. Terminals 111, 113 both connect to node 115, through which they can receive signals from an external source, such as read and write signals associated with a device or system in which magnetic data storage cell 100 is incorporated. The storage cell 100 is capable of being written to or read from via the first terminal 111 and the second terminal 113. Magnetic data storage element 110 is configured to yield any of at least three distinct magnetoresistance output levels, corresponding to stable magnetic configurations, in response to spin-momentum transfer inputs via the terminals 111, 113. The discussion below provides more details on how magnetic element 110 provides such a configuration and such magnetoresistance output levels, according to the illustrative example of FIG. 1, and for additional embodiments related to later figures.

Figure 2:
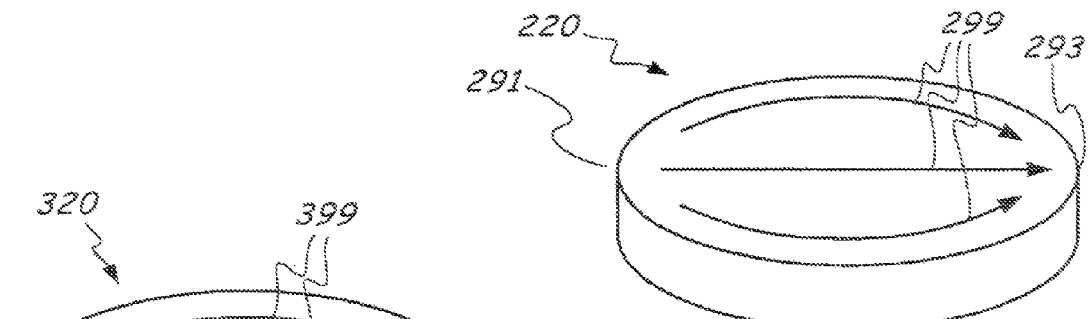
FIG. 2 depicts a perspective view of a magnetic layer in a diametrical magnetic phase, in accordance with an illustrative example.
Figure 3:
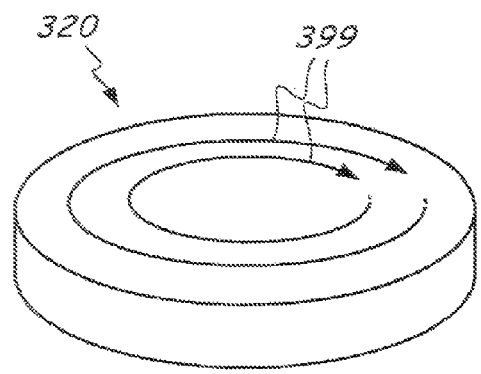
FIG. 3 depicts a perspective view of a magnetic layer in a cylindrical magnetic phase, in accordance with an illustrative example.
Figure 4:
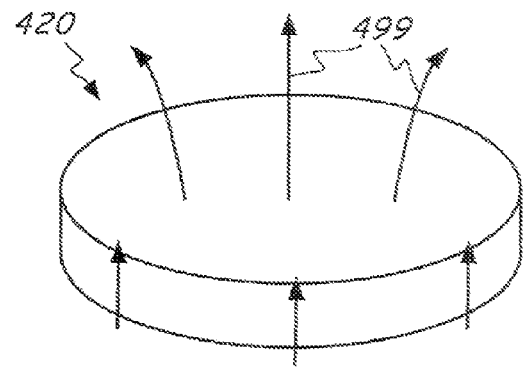
FIG. 4 depicts a perspective view of a magnetic layer in a perpendicular magnetic phase, in accordance with an illustrative example.

Magnetic data storage element 110 comprises two magnetic layers in this illustrative example: first magnetic layer 121, and second magnetic layer 123. First magnetic layer 121 has a thickness $T_1$ that is larger than the thickness $T_2$ of second magnetic layer 123, while both magnetic layers 121 and 123 have substantially the same radius R, i.e. the same radius within nominal manufacturing tolerances, in this illustrative example. Magnetic layers 121, 123 are susceptible of assuming different magnetic states, including parallel and antiparallel magnetic states, but are also capable of assuming different magnetic phases, and different magnetic orientations within each of those phases. FIGS. 2, 3, and 4 illustrate three different magnetic phases in which one of the magnetic layers may enter.

Magnetic data storage element 110 also includes an intermediate, non-magnetic layer 122 between the two magnetic layers 121, 123. One type of intermediate layer that may be used is a tunnel barrier, configured for quantum tunneling magnetoresistance. For example, the tunnel barrier may be composed of an insulating material, such as a metal oxide that may include AlO, TaO and/or MgO. Another type of intermediate layer that may be used is a metal layer configured for giant magnetoresistance. Such an intermediate layer may be composed of a high-conductance metal such as gold, silver, or copper, for example. Other types of intermediate layers configured for other purposes may be used in other examples.

FIG. 2 shows illustrative magnetic layer 220 in a diametrical, or "onion", magnetic phase. Magnetic layer 220 has magnetization 299 extending from a pole 291 on the circumference of layer 220 to a second pole 293 disposed at an opposing point on the circumference of layer 220 (and exhibiting more complicated behavior external to layer 220). The orientation of the magnetization depicted in FIG. 2 defines a first magnetic polarity, while in a different magnetic configuration, magnetic layer 220 may also have its magnetization in a diametrical phase but with the opposite orientation, with the magnetization oriented from second pole 293 to first pole 291, defining a polarity opposite to that depicted in FIG. 2. Two magnetic layers may be disposed in a stack with both layers in a diametrical magnetic phase, and with their magnetizations disposed in either of two polarities relative to each other, in either a parallel configuration, with the polarities of both layers oriented in the same direction, or in an antiparallel configuration, with their polarities oriented in opposing directions. A magnetic cell comprising a stack of two layers each with a diametrical magnetic phase, may exhibit either of two magnetoresistance outputs, corresponding to whether the layers are in parallel or antiparallel magnetic phases, as introduced above. However, different magnetic cells of the present disclosure may also, for example, incorporate layers in different magnetic phases, besides the diametrical, or "onion" phase depicted in FIG. 2. FIG. 3 depicts magnetic layer 320 in a cylindrical, or "vortex" magnetic phase, while FIG. 4 depicts magnetic layer 420 in a perpendicular, or "barrel", magnetic phase. The cylindrical phase and perpendicular phase also have opposing orientations, either one of which a magnetic layer may assume within the particular phase.

FIG. 3 depicts magnetic layer 320 with magnetization 399 in a cylindrical or "vortex" magnetic phase, disposed circularly around a central axis. As depicted in FIG. 3, magnetic layer 320 includes magnetization 399 oriented in a clockwise, or left-handed, chirality. A magnetic layer in a cylindrical magnetic phase may also be oriented in a counterclockwise, or right-handed, chirality, where the magnetization is oriented opposite to those depicted in FIG. 3. Two such magnetic layers stacked together in a magnetic cell may have parallel chirality, in which both have chirality in the same orientation, resulting in a lower magnetoresistive output level, or they may have antiparallel chirality, in which the chiralities of the two layers are in opposite orientations, resulting in a higher magnetoresistive output level.

FIG. 4 depicts magnetic layer 420 with magnetization 499 in a perpendicular magnetic phase, disposed substantially parallel to a central perpendicular axis of the magnetic layer 420 within the layer (and exhibiting more complicated behavior external to layer 420). As depicted in FIG. 4, magnetization 499 is directed in an "upward" direction relative to magnetic layer 420, while magnetization 499 may equally likely be disposed in an opposite, "downward" direction, and two stacked magnetic layers in the perpendicular magnetic phase may have their magnetizations arranged in parallel, both oriented in either the upward or downward direction together, or their magnetizations may be antiparallel, oriented in opposite directions, resulting in a higher magnetoresistive output level.

Two stacked layers may therefore each be in any of the three magnetic phases depicted in FIGS. 2-4, and if in the same phase, may be either parallel or antiparallel to each other. The magnetic layers may also be induced to switch orientations and/or to switch from one magnetic phase to another, by the influence of spin-momentum transfer inputs through terminals at either end of a magnetic cell containing a stack of two or more magnetic layers, as depicted in FIG. 1. A wide variety of different magnetoresistive output levels may therefore be encoded in a single magnetic cell, resulting from a variety of different combinations of magnetic phases and/or orientations that may be selectively induced in the layers within a cell. More about how one or more of the layers may be induced to switch to a different magnetic orientation or to a different magnetic phase, and about the resulting variety of magnetoresistive output levels that may be encoded within a single magnetic cell, is provided below, including with reference to FIGS. 5 and 6.

Each of two adjacent, stacked magnetic layers may be in any of the magnetic phases described above and depicted in FIGS. 2-4, and in either of the orientations available within each of the phases, i.e. in either of the polarities of the diametrical phase, in either of the chiralities of the cylindrical phase, and in either of the polarities of the perpendicular phase. The combined set of options, including different magnetic phases and orientations, defines six different magnetic states, which a particular magnetic layer may assume. A stack of two adjacent magnetic layers taking advantage of any of these magnetic states may therefore yield any of 36 different magnetic orientations, i.e. the product of any of the six magnetic states in each of the two adjacent layers, where each combination of two adjacent states defines a different magnetic configuration.

In the present illustrative example, the phases are linearly independent of each other, and the orientations of the layers therefore do not affect the configuration or the magnetoresistive output level of a magnetic cell if the layers within the cell are in different magnetic phases. Only if the layers are in the same phase, do the orientations of the layers then determine whether the combined stack is in a parallel or antiparallel configuration. The different magnetoresistive output levels available to a magnetic cell with two stacked layers are therefore defined, if other variables are ignored, by taking any of the three magnetic phases for one of the layers, combined with the other layer having any of the three available phases, and either available orientation if in the same phase as the first layer, for a total of twelve different available configurations. Additional variables are also discussed below which may further multiply the number of available configurations for a single magnetic cell.

The capability of manipulating the magnetic phase and orientation of the magnetic layers is discussed in additional detail as follows. When a spin-polarized current passes through a magnetic material, the transfer of angular momentum from the spins exerts a torque on the magnetic moment of the material. In magnetic bilayers consisting of a fixed, or reference, magnetic layer, and a free layer, such as fixed layer 121 and free layer 123 of FIG. 1, the spin-polarized current transfers angular momentum from the fixed layer to the free layer, exerting a torque on the free layer. In the magnetic element 110 the current is driven vertically through the stack, between terminals 111 and 113, such that spin torque drives the free layer 123 parallel to the fixed layer 121 for a positive bias (electron flow from lower terminal 111 to upper terminal 113), and antiparallel for a negative current bias (electron flow from upper terminal 113 to lower terminal 111). The Landau-Lifshitz Equation is applicable to describe this effect on the free layer dynamics, by incorporating the effects of the magnetization from a spin-polarized current:

$$\frac{d\vec{M}_{free}}{dt} = -\frac{\mu_0 \gamma \vec{M} \times \vec{H}}{(1+\alpha^2)} - \frac{\mu_0 \gamma \alpha}{M_S(1+\alpha^2)} M_{free} \times (\vec{M}_{free} \times \vec{H}) + \frac{\hbar}{2e} \frac{(\varepsilon \cdot I)}{V} \frac{\gamma}{M_{S_{free}}^2 M_{S_{fixed}}} \vec{M}_{free} \times (\vec{M}_{free} \times \vec{M}_{fixed})$$

where I is the current flowing perpendicular to the plane (CPP) of the magnetic layers, $M_{sfree}$ is the free-layer saturation magnetization, $M_{sfixed}$ is that of the fixed layer, $\varepsilon$ is an efficiency factor related to the spin polarization of the current, and V is the volume of the free layer.

Solutions to this equation yield a critical current density, $J_c$, beyond which the magnetization of the free layer can be driven either parallel or antiparallel to the fixed layer, depending on the direction of current flow. The current density depends on several variables, such as magnetic field and physical parameters of the free layer, according to the equation:

$$J_c \propto \alpha \cdot t(H \pm M_s)$$

where t is the free layer thickness.

These principles of spin torque manipulation of the magnetic layers are equally applicable to the additional illustrative examples that follow.

Figure 5:
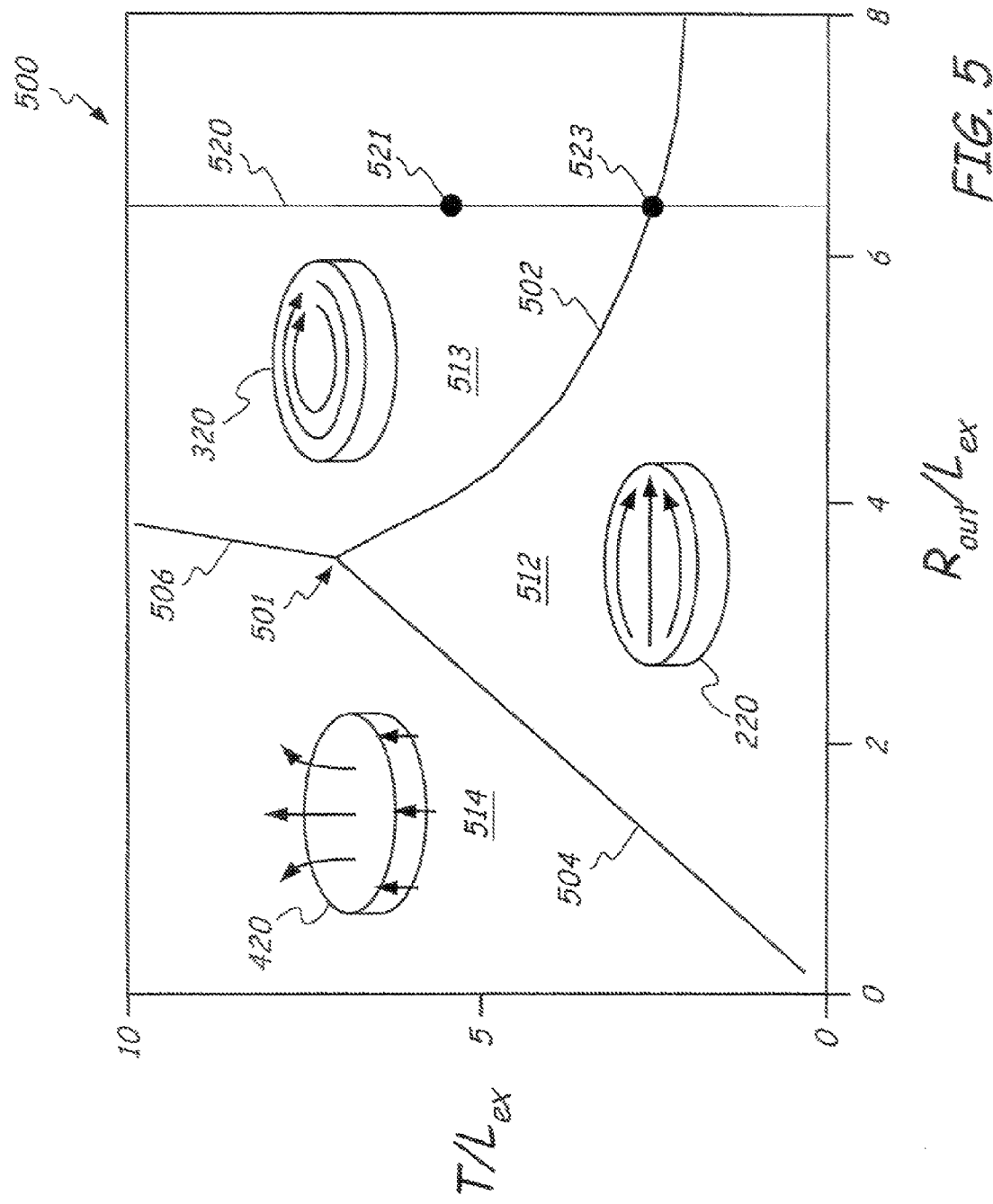
FIG. 5 depicts a phase diagram for a magnetic layer as a function of the radius and thickness of the magnetic layer, in accordance with an illustrative example.

FIG. 5 depicts a phase diagram 500 for a magnetic layer as a function of the radius and thickness of the magnetic layer, in accordance with an illustrative example. The x axis is provided in terms of increasing outer radius, such as the radius indicated with the measure R of magnetic layers 121 and 123 in FIG. 1; while the y axis is provided in terms of increasing thickness, such as the thicknesses indicated with the measures $T_1$ of magnetic layer 121 and $T_2$ of magnetic layer 123 in FIG. 1. Border 502, border 504, and border 506 indicate lines of bi-stable states—that is, sets of parameters of radius and thickness of a magnetic layer, in which the layer has equal minima of energy for either of two magnetic phases, so that it is equally stable in either of those two magnetic phases. Borders 502, 504, and 506 all meet at triple point 501, which indicates a tri-stable state—that is, a unique set of radius and thickness at which a magnetic layer has equal minima of energy in any of the three different available magnetic phases, and is equally likely to assume any of the three states. Borders 502, 504, and 506 separate three regions 512, 513, 514 of mono-stable states from each other.

In particular, the region 512 of the graph describes a set of parameters of radius and thickness in which a magnetic layer has a lowest energy minimum in the diametrical, or onion, magnetic phase, as is the case with magnetic layer 220; the region 513 of the graph describes a set of parameters of radius and thickness in which a magnetic layer has a lowest energy minimum in the cylindrical, or vortex, magnetic phase, as is the case with magnetic layer 320; and the region 514 of the graph describes a set of parameters of radius and thickness in which a magnetic layer has a lowest energy minimum in the perpendicular magnetic phase, as is the case with magnetic layer 420. Border 502 describes the set of parameters in which the energy minima become equal for either the onion or vortex magnetic phases, i.e. the phases of either of magnetic layers 220 and 320; border 504 describes the set of parameters in which the energy minima become equal for either the onion or perpendicular magnetic phases, i.e. the phases of either of magnetic layers 220 and 420; and border 506 describes the set of parameters in which the energy minima become equal for either the vortex or perpendicular magnetic phases, i.e. the phases of either of magnetic layers 320 and 420.

The radius and thickness described on the x and y axes are both normalized in terms of a scale length, referred to as the magnetic exchange length, $L_{ex}$, so that the radius is given in terms of outer radius of the magnetic layer divided by magnetic exchange length, or $R_{out}/L_{ex}$; and the thickness is given in terms of thickness of the magnetic layer divided by magnetic exchange length, or $T/L_{ex}$. The particular values provided along the axes are merely representative of one illustrative example, and depend on many factors, such as what material the layers are made of. One advantage of scaling factor $L_{ex}$ is that it renders phase diagram 500 applicable to any magnetic material, given that material's magnetic exchange length. For example, one illustrative material from which magnetic layers may be composed is Permalloy (Py), which has a magnetic exchange length of 5.7 nanometers. The magnetic exchange length for a given material is determined by the exchange constant A of the material, the saturation magnetization $M_s$, and the magnetic permeability of free space $\mu_o$, according to the following formula:

$$L_{ex} = \sqrt{2A/(\mu_0 M_s^2)}$$

Referring again to FIG. 1 in comparison with FIG. 5, magnetic layers 121, 123 of magnetic data storage element 110 in FIG. 1 have substantially the same radius, while layer 121 has a significantly greater thickness than layer 123. The sets of radius and thickness parameters of layers 121 and 123 may therefore be plotted on magnetic phase diagram 500, as position 521 for layer 121, and position 523 for layer 123. The positions of the two layers are vertically displaced from each other on the graph, along axis 520 which represents a given value of radius that both layers have in common, but with varying values of thickness. Position 521 representing magnetic layer 121 is in region 513 of the phase diagram, with considerable margins separating it from the bi-stable borders, and has a clear global energy minimum in the vortex phase; while position 523, representing magnetic layer 123, at the same radius but with a lower thickness than for position 521, is disposed proximate to border 502, so that it has closely balanced local energy minima in both the vortex phase and the onion phase. Layers 121 and 123, and their corresponding positions 521 and 523 on the magnetic phase diagram 500, are representative examples selected to illustrate the principles involved, while other examples may include a variety of magnetic layers with any combination of physical parameters lying in any areas of magnetic phase diagram 500, depending on the particular design.

Figure 6:
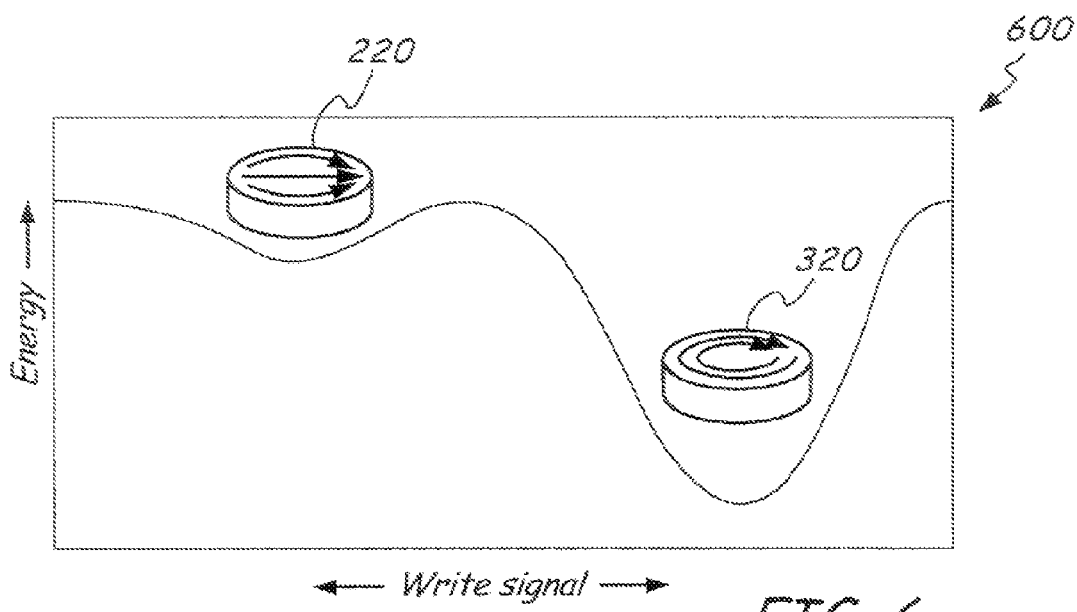
FIG. 6 depicts a graph of energy as a function of a write signal for different magnetic phases, for a magnetic layer having a first set of physical parameters, in accordance with an illustrative example.
Figure 7:
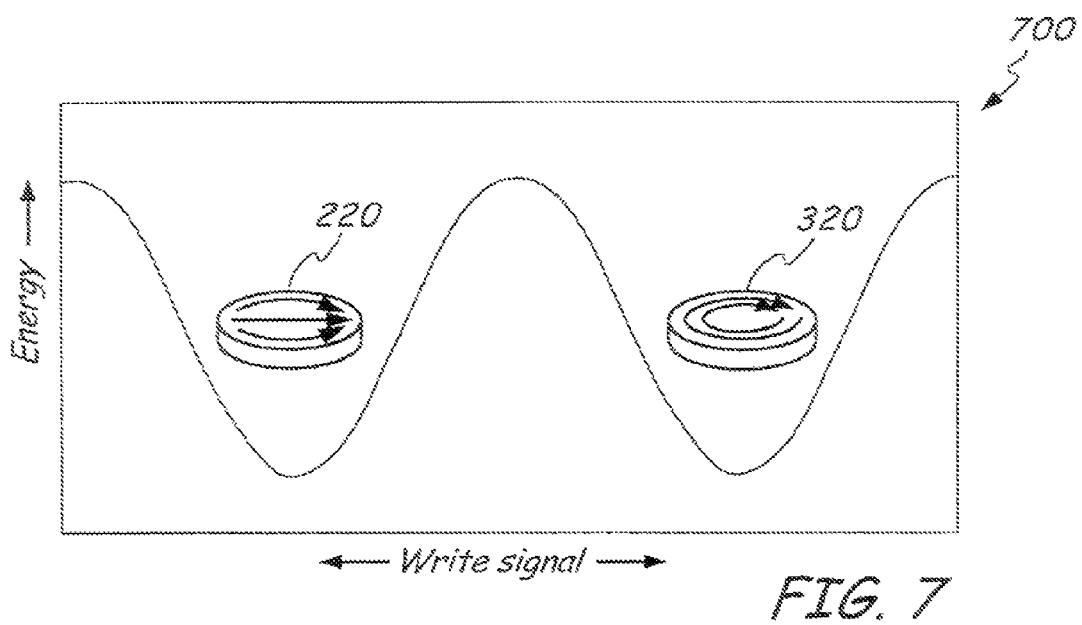
FIG. 7 depicts a graph of energy as a function of a write signal for different magnetic phases, for a magnetic layer having a second set of physical parameters, in accordance with an illustrative example.

FIGS. 6 and 7 provide further illustration of how the energy profiles as a function of magnetic phase are dependent on the parameters represented in magnetic phase diagram 500, as illustratively indicated with positions 521 and 523. The write signals indicated in FIGS. 6 and 7 may include any signal that may convey a spin-momentum transfer or otherwise function to influence the energy of a magnetic layer, such as current, voltage, magnetic field, and so forth.

FIG. 6 depicts graph 600 of energy as a function of a write signal for different magnetic phases, for a magnetic layer such as layer 121 with physical parameters that place it well within one of the mono-stable regions of phase diagram 500. In this particular case, layer 121 has a global energy minimum in the vortex phase, so that it will easily enter that phase, and then remain in that phase stably, such that only a large input of energy would be required to force it back out of the vortex state. Layer 121 still has a local energy minimum for the onion phase, but which is dwarfed by the global energy minimum for the vortex phase, and would not significantly affect the stable disposition of layer 121 in the vortex phase under operating conditions in which energy inputs are constrained to significantly below the potential well of the global minimum.

FIG. 7, on the other hand, depicts graph 700 of energy as a function of a write signal for different magnetic phases, for a magnetic layer such as layer 123 with physical parameters that place it close to one of the phase borders of phase diagram 500, such as border 502 in the case of layer 123. Layer 123 has substantially equivalent energy minima for both the onion and vortex phases, so that it can remain stably in either phase, but can also shift from stably occupying one of the two phases to stably occupying the other phase in response to a signal corresponding to the magnetoresistive output level barrier between the two phases. Such a signal may be a data write signal, which may take the form of a spin-aligned current that may convey a spin-momentum transfer signal, as an illustrative example.

With two layers stacked together in series between two terminals, such as layers 121 and 123 between terminals 111 and 113 in magnetic data storage element 110, the two layers may therefore exhibit very different responses to the same signal conveyed via the terminals, due to the effects discussed above with reference to FIGS. 2-7. Because layer 121 has a combination of thickness and radius that place it in monostable region 513 of magnetic phase diagram 500, while layer 123 has a combination of thickness and radius that make it bi-stable between the onion and vortex states, a single signal may be conveyed to magnetic element 110 via the terminals that will leave layer 121 undisturbed in its vortex phase with a given chirality, but will simultaneously induce layer 123 either to transition from onion to vortex state or vice versa, or to flip its orientation within one of those phases, i.e. either to flip to the opposite polarity within the onion phase or to the opposite chirality within the vortex phase. The thicker magnetic layer 121 may therefore serve as a fixed layer while the thinner magnetic layer 123 serves as a free layer. This combination means that magnetic element 110 may encode any of three stable magnetoresistive output levels: a first, highest output level, with magnetic layer 123 in the vortex phase with an antiparallel chirality with layer 121; a second, intermediate output level, with magnetic layer 123 in a different phase as layer 121, i.e. the onion phase; and a third, lowest output level, with magnetic layer 123 in the vortex phase with a parallel chirality with layer 121.

Figure 8:
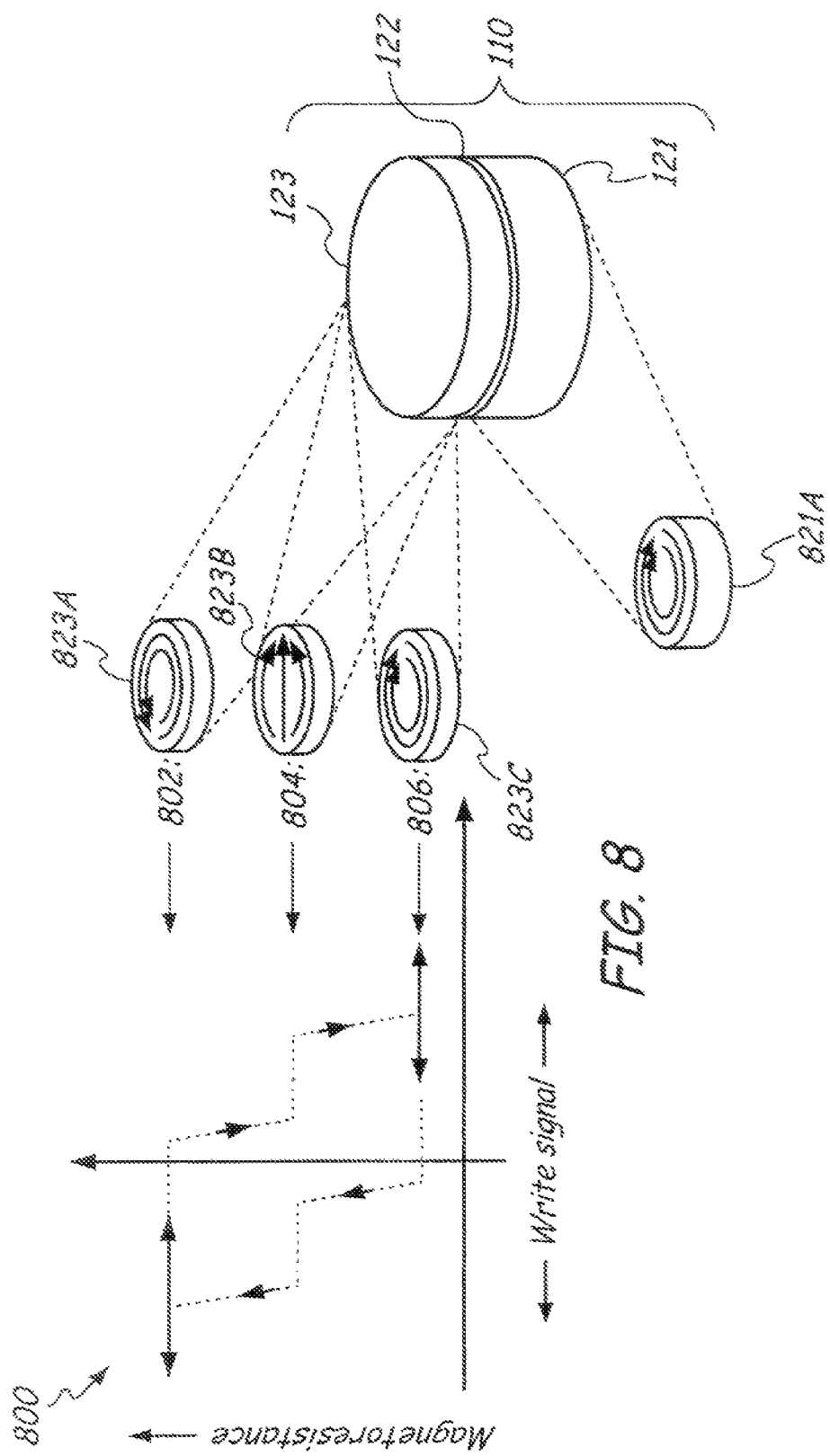
FIG. 8 depicts a graph of magnetoresistance output levels in relation to a write signal for different combinations of magnetic phases of the different layers within a compound magnetic data storage element, in accordance with an illustrative example.

These three different magnetoresistive output levels are depicted in FIG. 8. FIG. 8 depicts a graph 800 of magnetoresistance output levels in relation to a write signal for the three different combinations of magnetic phases of layers 121, 123 as described above, for the illustrative example of magnetic data storage element 110. Magnetic data storage element 110 also includes intermediate, non-magnetic layer 122 between the two magnetic layers 121, 123. The magnetoresistance output levels define a stepped hysteresis loop, between a highest output level 802, an intermediate output level 804, and a lowest output level 806, corresponding to the three stable magnetic configurations of the magnetic data storage element 110. The thicker magnetic layer 121 remains fixed in a vortex phase with a given chirality, as depicted at 821A. The thinner magnetic layer 123 remains free to respond to write signals by transitioning freely between any of three magnetic states: vortex phase with antiparallel chirality to the other layer 121, as depicted at 823A; onion phase, as depicted at 823B; or vortex phase with parallel chirality, as depicted at 823C. Magnetic data storage element 110 is therefore configured to yield any of three distinct magnetoresistive output levels, corresponding to stable magnetic configurations, in response to spin-momentum transfer inputs via the terminals 111 and 113 as depicted in FIG. 1. Magnetic layers 121 and 123 are therefore configured to respond to different write inputs by yielding any of three stable magnetic configurations, including: a first stable magnetic configuration in which the two magnetic layers 121 and 123 are magnetized in antiparallel cylindrical (i.e. vortex) magnetic states; a second stable magnetic configuration in which magnetic layer 121 is magnetized in a cylindrical magnetic state and magnetic layer 123 is magnetized in a diametrical (i.e. onion) magnetic state; and a third stable magnetic configuration in which the two magnetic layers 121, 123 are magnetized in parallel cylindrical magnetic states.

Figure 9:
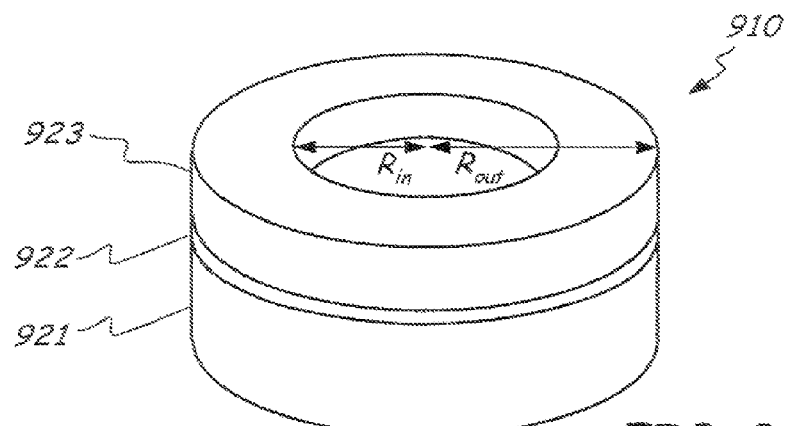
FIG. 9 depicts a perspective view of another compound magnetic data storage element, in accordance with another illustrative example.

FIG. 9 depicts a different illustrative example of a magnetic data storage element 910 that may be used in a magnetic data storage cell. Magnetic data storage element 910 also includes two magnetic layers, layers 921 and 923, stacked adjacent to each other, separated by intermediate, non-magnetic layer 922, which may illustratively be configured for quantum tunneling magnetoresistance or giant magnetoresistance. In magnetic element 910, however, magnetic layer 921 is formed as a solid body, as are layers 121 and 123 discussed above, while magnetic layer 923 is formed as an annular, or ring-shaped, body, with an inner radius $R_{in}$, defining a cavity in the interior of layer 923. $R_{out}$ defines the outer radius of magnetic layer 923, as with layers 121 and 123 discussed above. The annular as opposed to solid form of the magnetic layer 923 provides substantial differences in magnetic behavior, as depicted in FIG. 10.

Figure 10:
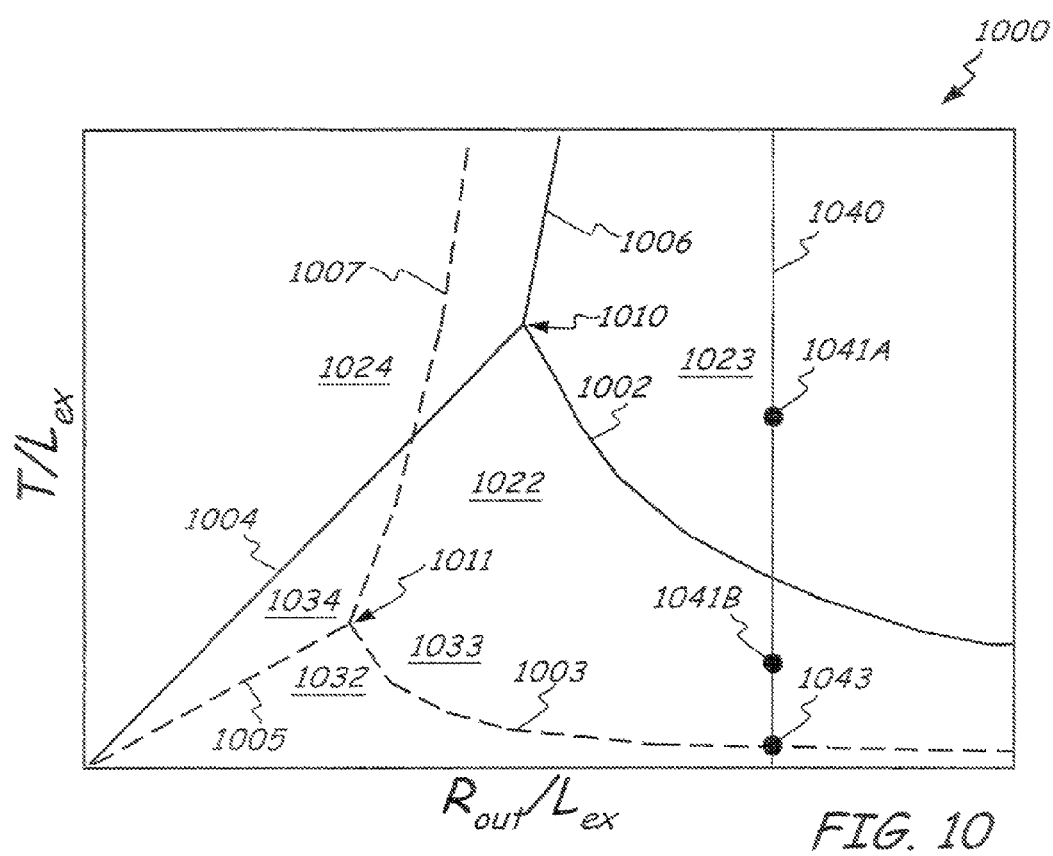
FIG. 10 depicts a phase diagram for several magnetic layers as a function of the radius and thickness of each of the magnetic layers, in accordance with an illustrative example.

FIG. 10 depicts magnetic phase diagram 1000, which indicates magnetic phase energy minima for each of the two different magnetic layer morphologies depicted in FIG. 9, as functions of both outer radius and thickness of the layers. Borders 1002, 1004, and 1006 indicate the bi-stable parameter sets for a solidly formed magnetic layer, and triple point 1010 indicates the tri-stable parameter set for a solidly formed magnetic layer, as also depicted in FIG. 2, while borders 1003, 1005, and 1007 indicate the bi-stable parameter sets, and triple point 1011 indicates the tri-stable parameter set, for an annularly formed magnetic layer such as layer 923 in FIG. 9. The separate regions 1022, 1023, 1024 of monostable magnetic phases for the solidly formed body are the same as described above with reference to FIG. 2, while an analogous arrangement of regions corresponding to magnetic phases holds for the annularly formed body. In particular, for an annularly formed body, region 1032 of phase diagram 1000 indicates the parameter sets with a global energy minimum for the diametrical, or "onion" magnetic phase; region 1033 indicates the parameter sets with a global energy minimum for the cylindrical, or "vortex" magnetic phase; and region 1034 indicates the parameter sets with a global energy minimum for the perpendicular, or "barrel" magnetic phase.

As is apparent, the vortex phase region 1033 for the annular body overlaps the entire vortex phase region 1022 for the solidly formed body, as well as part of the barrel phase region 1024 for the solid body; the barrel phase region 1034 for the annular body overlaps only part of the barrel phase region 1024 for the solid body, and overlaps a portion of the onion phase region 1022 for the solid body; and the onion phase region 1032 for the annular body occupies only a small portion of the onion phase region 1022 for the solid body. Those differences in the phase regions of the graph indicate differences in the magnetic phase response behavior of a given magnetic body depending on whether or not it is solidly or annularly formed, and is taken advantage of in the design of the magnetic data storage element 910, as further discussed below.

An annularly formed body may be classified by the ratio of inner radius $R_{in}$ to outer radius $R_{out}$. This ratio, which may be labeled β, may range from 0 for a solid body, to approaching 1 for a very thin annular body. In the case of layer 923 of FIG. 9 and its magnetic phase indications in FIG. 10, β may equal 0.6, for example. Any other radii ratio β may be used in a magnetic layer within a magnetic data storage cell. The phase diagrams for layers with such other values of β, across at least a portion of the possible values, approximately resemble the two depicted in FIG. 10 but with the triple point in general pulled increasingly closer to the origin (i.e. the lower left corner) of the graph, the onion phase region in general contracting to an increasingly smaller area of low $T/L_{ex}$ values, the barrel phase region in general contracting to an increasingly smaller area of low $R_{out}/L_{ex}$ values, and the vortex phase region in general expanding into the territory lost by the other two phase regions, for increasingly higher values of β. Any such layers may be used within a magnetic data storage cell of different embodiments.

Referring again to FIG. 10 in comparison with FIG. 9, magnetic layers 921, 923 of magnetic data storage element 910 in FIG. 9 again have substantially the same radius, while layer 921 has a significantly greater thickness than layer 923. The sets of radius and thickness parameters of layers 921 and 923 may therefore be plotted on magnetic phase diagram 1000, according to a couple of different illustrative examples. In both examples, both layers 921 and 923 are once again formed with substantially the same outer radius $R_{out}$, so they can both be plotted along a vertical axis 1040 corresponding to a common value of $R_{out}$. In a first illustrative example, the radius and thickness of layer 921 may be plotted as position 1041A, while in the second illustrative example, the radius and thickness of layer 921 may be plotted as position 1041B; while the radius and thickness of layer 923 may be plotted as position 1043 for both of the present illustrative examples.

In the first example, as indicated at parameter set 1041A, magnetic layer 921 is definitively within the mono-stable vortex region of the magnetic phase diagram 1000 for a solidly formed body. Thinner, annularly formed magnetic layer 923 is formed with a set of outer radius and thickness parameters that places is at approximately the bi-stable border 1003 between the onion phase region 1032 and the vortex phase region 1033 for an annularly formed body of β=0.6. Annular layer 923 is therefore free to transition between different magnetic configurations, including bi-stable magnetic phases and spin-aligned-current-induced orientations within those phases, while annular layer 921 is fixed in the mono-stable vortex phase with a given chirality. This once again yields three different stable magnetic configurations for the magnetic data storage element 910 containing magnetic layers 921 and 923, as was the case with the prior example discussed above. In particular, the thicker magnetic layer 921 is once again fixed in a vortex magnetic phase with a given chirality, while the thinner, and now annular, magnetic layer 923 is freely manipulable with externally induced write currents to transition between an antiparallel-oriented vortex phase, an onion phase, or a parallel-oriented vortex phase, with the stacked combination yielding any of three distinct magnetoresistance output levels. In this example, however, the annular body has resulted in another independent parameter, the inner radius, that can also be varied at will in the design of the magnetic layers, along with the material, the outer radius, and the thickness, to determine their magnetic phase behavior.

The additional differences provided by the inner radius of the annular body include, for example, elimination of the fringe fields due to a vortex core, and being able to use thinner layers overall, resulting in a smaller size per magnetic cell and a greater storage density. Considering magnetic phase diagram 1000, magnetic layer 923 is able to be in a bi-stable state with a much lower thickness than if a solidly formed layer were used, for which the bi-stable border between onion and vortex phases is at a much higher thickness for a given radius. The lower thickness not only means a lower thickness for the entire magnetic cell, but also reduced mass from the lack of material in the cavity of the annular body, and better heat dissipation of the layer due to a higher ratio of surface area to volume, for example.

The second illustrative example involved in FIG. 10 mentioned above involves replacing the parameters of magnetic layer 921 with those indicated at position 1041B of magnetic phase diagram 1000. With the parameters corresponding to this position, the fixed magnetic layer 921 is still thicker, but not by as much, and is now fixed in a mono-stable onion phase rather than vortex phase. It is also fixed in a given orientation, which in the case of the onion phase means a given polarity, as opposed to a given chirality in the vortex phase. The thinner, annular magnetic layer retains the same parameters in this example, and is still equally bi-stable between the onion and vortex phases, except that now, the antiparallel onion phase will provide the highest magnetoresistive output level in combination with the adjacent layer being fixed in the onion phase, the parallel onion phase will provide the lowest magnetoresistive output level, and the annular layer 923 being in the vortex phase will provide an intermediate magnetoresistive output level. In this example, therefore, the magnetic element 910 once again yields three stable magnetic configurations with three distinct magnetoresistance output levels, but using a different suite of magnetic configurations. This example also provides additional differences, such as having the relatively thick magnetic layer 921 being substantially thinner, therefore potentially further reducing the total mass and volume of magnetic data storage element 910 and further increasing the data storage density of a data storage system containing an array of such cells.

Magnetic data storage element 110 of FIG. 1, and magnetic data storage element 910 of FIG. 9 (in accordance with either example of element 910), therefore both provide three distinct magnetoresistance output levels per single magnetic cell, as opposed to only two output levels in traditional magnetic cells. However, still other illustrative examples are provided herein that may provide still more distinct magnetoresistance output levels per single magnetic cell, such as those discussed below.

Figure 11:
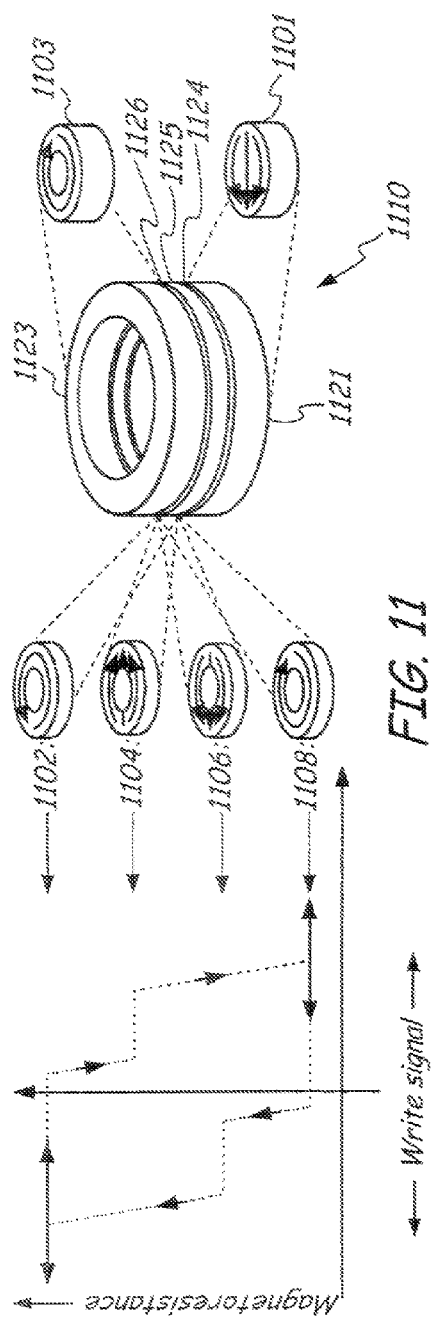
FIG. 11 depicts a perspective view of another compound magnetic data storage element and a graph of magnetoresistance output levels in relation to a write signal for different combinations of magnetic phases of the different layers within the compound magnetic data storage element, in accordance with another illustrative example.

FIG. 11 depicts a perspective view of another compound magnetic data storage element 1110 that may also be used in a magnetic data storage cell, along with an output level graph 1100 of magnetoresistance output levels in relation to a write signal for different combinations of magnetic phases of the different layers within the compound magnetic data storage element 1110, in accordance with another illustrative example. Magnetic data storage element 1110 includes a stack of three magnetic layers, 1121, 1123, and 1125. Solidly formed, relatively thick layer 1121 is disposed on one end of the stack; annularly formed, relatively thick layer 1123 is disposed on the other end of the stack; and annularly formed, relatively thin layer 1125 is disposed in the middle of the stack, between layers 1121 and 1123. Each adjacent pair of magnetic layers is separated by an intermediate, non-magnetic layer configured for giant magnetoresistance, quantum tunneling magnetoresistance, or some other type of magnetoresistance, in this illustrative embodiment. In particular, magnetic layers 1121 and 1125 are separated by intermediate, non-magnetic layer 1124, and magnetic layers 1125 and 1123 are separated by intermediate, non-magnetic layer 1126. This design enables magnetic data storage element 1110 to yield any of four distinct magnetic configurations, corresponding to four distinct magnetoresistance output levels, in a single cell, as indicated in output level graph 1100. This may provide still further increases in data storage density, for a data storage system comprising magnetic elements of the type depicted in the illustrative magnetic element 1110.

In particular, in this illustrative example, solid layer 1121 is fixed in an onion (i.e. diametrical) magnetic phase, with a fixed orientation (i.e. with a negative polarity in the example depicted, as indicated at 1101, where "positive" and "negative" polarity are arbitrarily selected to correspond to rightward and leftward oriented magnetizations in the depiction of FIG. 11), and annular layer 1123 is fixed in a vortex (i.e. cylindrical) magnetic phase, with a fixed orientation (i.e. with a left-handed chirality in the example depicted, as indicated at 1103). Thin annular layer 1125 between them is susceptible of freely transitioning between bi-stable states in either onion or vortex phase, and in either polarity of the onion phase and either chirality of the vortex phase. This arrangement means that freely transitioning layer 1125 will always be in the same phase as either one or the other of its adjacent layers 1121, 1123, and always either in a parallel or antiparallel orientation as that same-phase layer. This yields four distinct, equally stable magnetoresistance output levels, for the parameters selected for the magnetic layers.

As depicted in FIG. 11, the middle layer 1125 differs between four magnetic states, including either of two orientations each in either of two magnetic phases, while the top and bottom layers 1121, 1125 remain in fixed phases and orientations, meaning that the combination of layers in magnetic element 1110 yields four different stable magnetic configurations, as functions of the phase and orientation of the middle layer 1125. As depicted in output level graph 1100, those four stable magnetic configurations include four stable magnetic configurations, which are described as follows in descending order of magnetoresistance output level, as shown in output level graph 1100. In one magnetic configuration indicated at 1102, middle layer 1125 is in the vortex phase with right-handed chirality, such that layers 1125 and 1123 are magnetized in antiparallel magnetic states in the vortex magnetic phase. In a second magnetic configuration indicated at 1104, middle layer 1125 is in the onion phase with positive polarity, such that layers 1125 and 1121 are magnetized in antiparallel magnetic states in the onion magnetic phase. In a third magnetic configuration indicated at 1106, middle layer 1125 is in the onion phase with negative polarity, such that layers 1125 and 1121 are magnetized in parallel magnetic states in the onion magnetic phase. And in a fourth magnetic configuration indicated at 1108, middle layer 1125 is in the vortex phase with left-handed chirality, such that layers 1125 and 1123 are magnetized in parallel magnetic states in the vortex magnetic phase.

Figure 12:
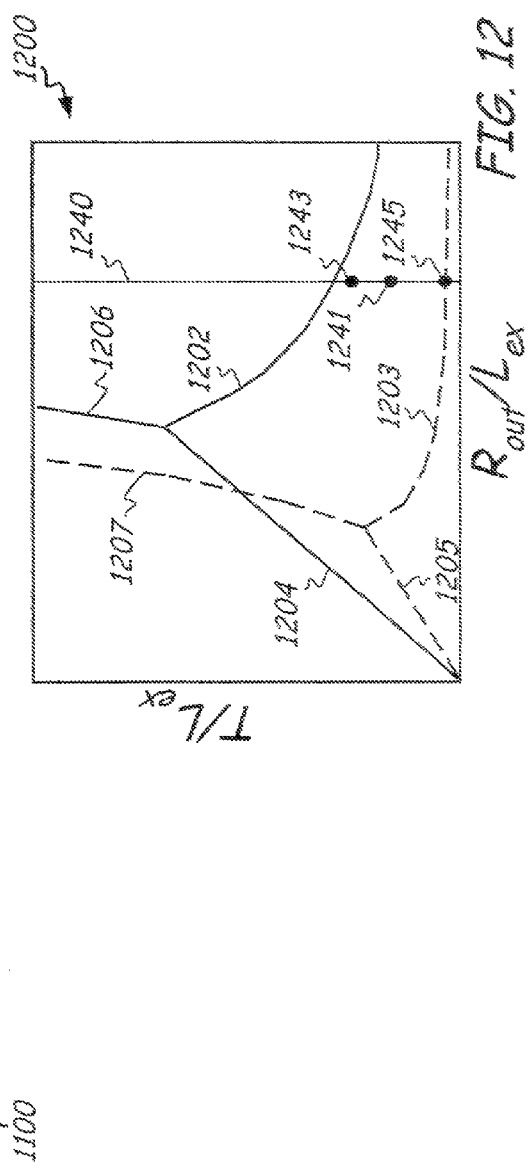
FIG. 12 depicts a phase diagram for several magnetic layers as a function of the radius and thickness of each of the magnetic layers, in accordance with an illustrative example.

FIG. 12 depicts a phase diagram for magnetic layers 1121, 1123, 1125 of magnetic element 1110 depicted in FIG. 11, as a function of the radius and thickness of each of the magnetic layers. Positions 1241, 1243, and 1245 are representative of the outer radius and thickness parameters of magnetic layers 1121, 1123, and 1125, respectively. Positions 1241, 1243, and 1245 all lie within close intervals of axis 1240, indicating approximately the same radius for each of the layers. The phase region borders 1202, 1204, and 1206 for a solidly formed layer are indicated, as are the phase region borders 1203, 1205, 1207 for an annularly formed layer of $\beta=0.6$, as discussed above. The phase region borders 1202, 1204, 1206 are applicable to position 1241 for magnetic layer 1121, since it is solidly formed, while the phase region borders 1203, 1205, 1207 are applicable to positions 1243 and 1245 for magnetic layers 1123 and 1125, since they are annularly formed. Therefore, despite the proximity of positions 1241 and 1243, indicating the similar outer radii and thicknesses of magnetic layers 1121 and 1123, position 1241 is definitively within the region for the onion magnetic phase for a solidly formed body, and has a very mono-stable magnetization in the onion phase, while position 1243 is definitively within the region for the vortex magnetic phase for an annularly formed body of $\beta=0.6$, and has a very mono-stable magnetization in the vortex phase. Position 1245, meanwhile, is within a close interval to the border 1203 separating the onion and vortex phases for an annularly formed body of $\beta=0.6$ of the given outer radius and thickness, meaning it is substantially bi-stable in both magnetizations, and may easily respond to write signals of substantially similar magnitude to transition between the onion and vortex phases and then remain stably in the induced phase.

This further illustrates that magnetic element 1110 is capable of assuming any of four stable magnetic configurations, yielding four distinct magnetoresistance output levels. These four levels of such a compound magnetic cell may be assigned to a digital protocol in which they correspond with any of the four states of 00, 01, 10, and 11, so that a single magnetic cell containing magnetic element 1110 encodes two full bits of information, thereby fully doubling the spatial data storage density per cell, compared with traditional, non-compound magnetic cells that encode a single bit per cell. Magnetic element 1110 also does this while still maintaining the architecture of only two terminals per cell, such that all write and read signals needed to manipulate the cell 1110 into any of its four magnetic configurations and later read which of the four configurations it is in, can be done via just the two terminals connected to the cell at either end of the stacked layers, as depicted in the form of terminals 111 and 113 in FIG. 1.

The example of FIGS. 11 and 12 is illustrative only, and many other examples may also be used in which any number of layers may be disposed adjacent to each other in any arrangement, with any combination of physical parameters, materials, formations, fixed magnetic phases, and available free magnetic phases, in accordance with the principles discussed herein.

Many options are therefore available to manipulate the available magnetic configurations of various compound magnetic cells, such as the thickness, the outer radius, whether or not a layer is solidly or annularly formed, the inner radius (in the case of annular layers), the number of layers used. Additional options that may also be used to further develop the storage capabilities of the cell include the selection of the magnetic materials of which the magnetic layers are composed, the use of pinning a magnetic layer, and the use of intermediate layers between the magnetic layers. These additional options are further explained as follows.

As mentioned above, the magnetic phase diagrams 500, 1000, 1200 are scaled using a scaling factor, the exchange length defined above, which is a function of the particular material of which the layer is composed. Therefore, using different materials for different layers also means that the absolute scale of the magnetic phase diagrams for those layer are varied from each other, and the magnetic phase behavior of each of the layers as a function of their absolute outer radii and thicknesses are correspondingly different. For example, it therefore becomes possible to have, for example, two layers of the same outer radius and the same thickness but different materials, where one is fixed in a stable magnetic phase and orientation, while the other lies on a bi-stable border in its particular magnetic phase diagram, and that layer is freely susceptible of transitioning to either of two magnetic phases and orientations. Examples of materials that may be used for the compositions of the magnetic layers include iron, cobalt, nickel, Permalloy, Heusler alloys, and any ferromagnetic materials. Heusler alloys that may be used may, for example, be composed of a combination of two parts of copper, nickel, cobalt, or a combination thereof one part manganese, chromium, iron, or a combination thereof and one part tin, aluminum, silicon, arsenic, antimony, bismuth, or boron, or a combination thereof. Those skilled in the relevant arts will recognize additional selections of materials that may be well-suited for a given application.

As another option that may be used for the magnetic layers of a magnetic data storage cell, one of the layers may be pinned into a selected magnetic phase, so that it may be kept fixed in a desired phase and orientation in spite of the phase that would be predicted according to its outer radius and thickness as indicated on one of the magnetic phase diagrams referenced above. For example, magnetic element 110 of FIG. 1 could be kept with the same outer radius and thickness as indicated at parameter set position 521 on magnetic phase diagram 500, but pinned in the onion magnetic phase, whereas it would otherwise be mono-stable in the vortex phase if the pinning were removed. Magnetic element 110 as modified by this pinning arrangement would then once again yield three stable magnetic configurations corresponding to three distinct magnetoresistance output levels, but with the highest and lowest of the three magnetoresistive output levels corresponding to antiparallel and parallel orientations of the two layers both in the onion phase. A variety of pinning techniques are understood by those of skill in the relevant arts Pinning therefore provides yet another independent parameter that may be varied in the design of different compound magnetic data storage cells.

Figure 13:
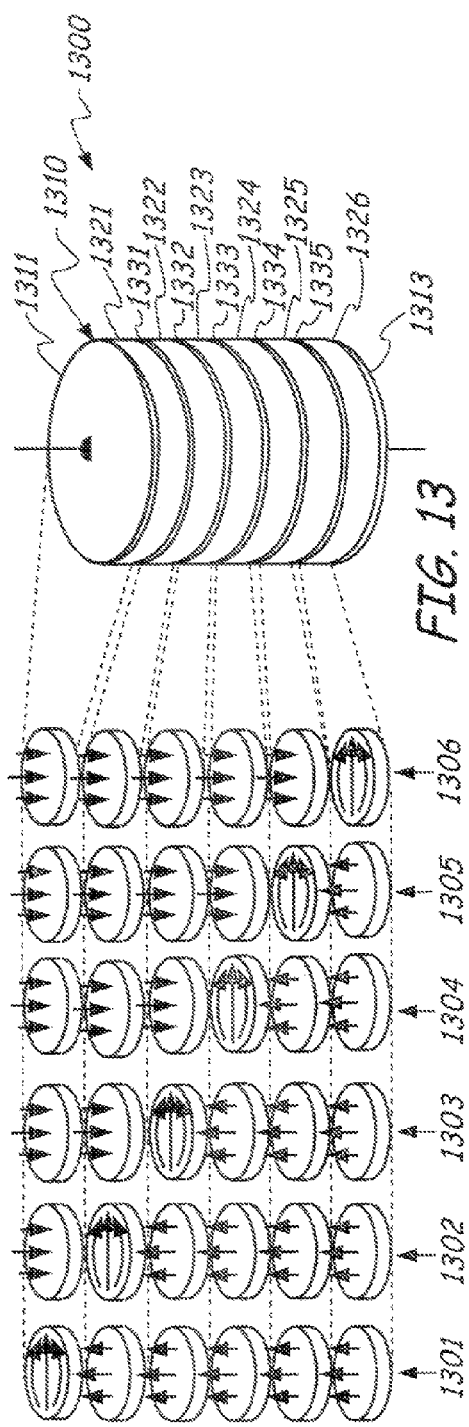
FIG. 13 depicts a perspective view of yet another compound magnetic data storage cell along with different potential magnetic states of the magnetic data storage element included therein, in accordance with another illustrative example.
Figure 15:
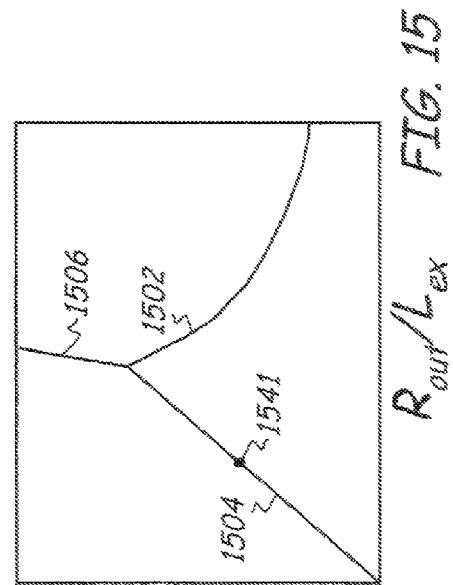
FIG. 15 depicts a phase diagram for several magnetic layers as a function of the radius and thickness of each of the magnetic layers, in accordance with an illustrative example.
Figure 14:
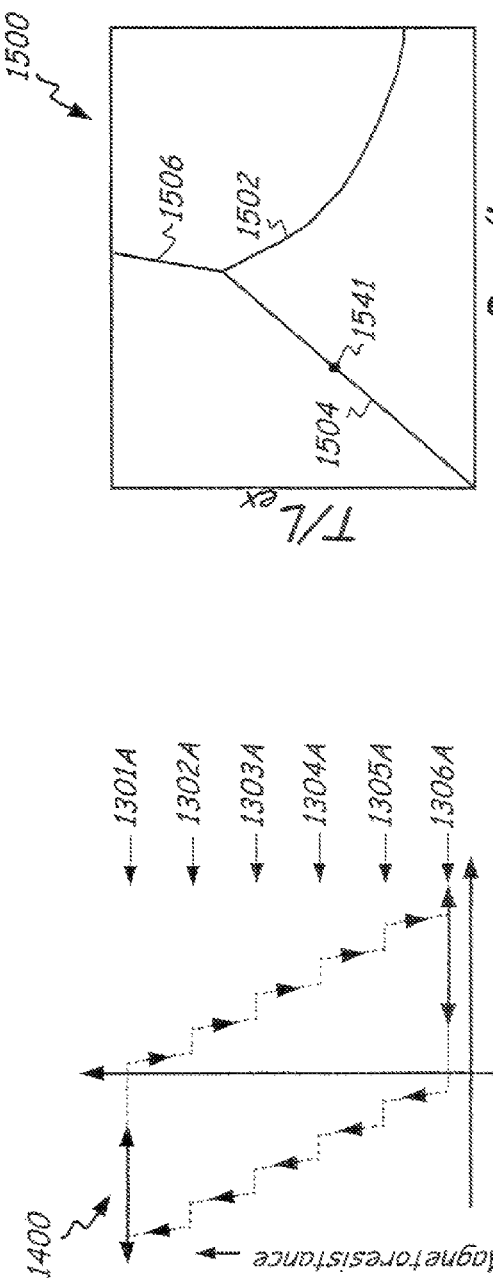
FIG. 14 depicts a graph of magnetoresistance output levels in relation to a write signal for different combinations of magnetic phases of the different magnetic layers within a compound magnetic data storage cell, in accordance with an illustrative example.
Figure 16:
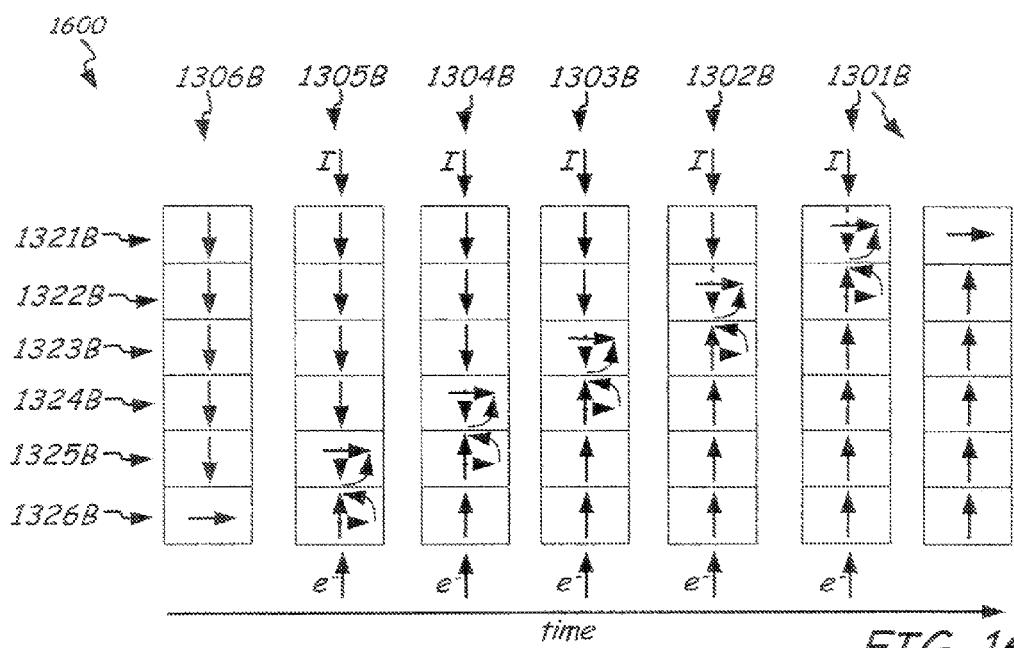
FIG. 16 depicts a time-ordered sequence of different magnetic states of a magnetic data storage element, in accordance with another illustrative example.
Figure 17:
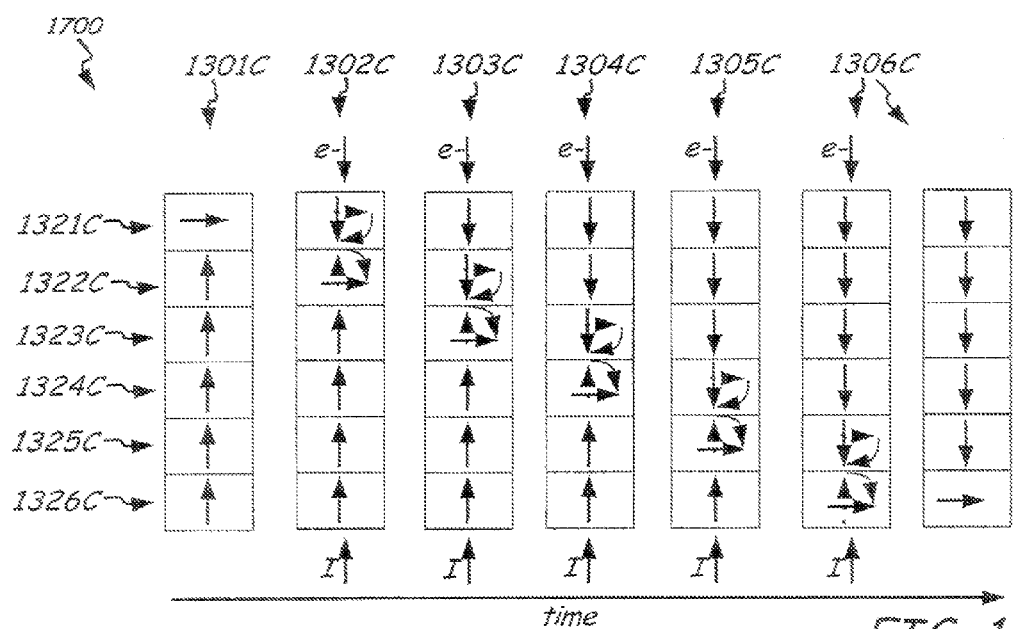
FIG. 17 depicts another time-ordered sequence of different magnetic states of a magnetic data storage element, in accordance with an illustrative example.

FIG. 13 depicts a perspective view of yet another compound magnetic data storage cell 1300 comprising magnetic data storage element 1310 that may also be used in a magnetic data storage cell, along with different potential magnetic configurations of the magnetic data storage element. Compound magnetic data storage cell 1300 illustrates another application of multiple magnetic phases, in this case for the propagation of a "discrete domain wall" through a multilayer magnetic stack. FIGS. 14-17 provide further information regarding the structure and function of data storage element 1310 of FIG. 13. In particular, FIG. 14 depicts an output level graph 1400 of magnetoresistance output levels of data storage element 1310 as a function of a write signal for different combinations of magnetic phases of the magnetic layers within the compound magnetic data storage element 1310. FIG. 15 depicts a phase diagram for the magnetic layers of magnetic data storage element 1310 as a function of the radius and thickness of each of the magnetic layers, in accordance with an illustrative example. FIGS. 16 and 17 depict different time-ordered sequences of different magnetic configurations of magnetic data storage element 1310.

As depicted in FIG. 13, magnetic data storage element 1310 includes a stack of six magnetic layers 1321, 1322, 1323, 1324, 1325, 1326, that are separated from each other by intermediate, non-magnetic layers 1331, 1332, 1333, 1334, 1335, that may be configured for quantum tunneling magnetoresistance, giant magnetoresistance, or other functions. Compound magnetic data storage cell 1300 also includes terminals 1311, 1313 disposed adjacent to the ends of magnetic data storage element 1310, in direct contact with magnetic layers 1321 and 1326, respectively. In the particular illustrative embodiment of magnetic data storage element 1310, all the magnetic layers 1321, 1322, 1323, 1324, 1325, 1326 are configured in a solidly formed body with the same radius and thickness. This is indicated in phase diagram 1500 in FIG. 15, which shows the radius and thickness of each of magnetic layers 1321, 1322, 1323, 1324, 1325, 1326 at position 1541 on the graph. A variety of other configurations may also be used in other embodiments, including with any number of magnetic layers, ring layers or combinations of ring and solidly formed layers, combinations of different layer thicknesses or other properties, and other variations.

Analogously to the phase diagrams described above, phase diagram 1500 depicts the scaled outer radius and the scaled thickness of the layers as the x and y axes, respectively, and depicts the bistable magnetic phase boundaries 1502, 1504, 1506 as functions of the scaled outer radius and thickness. In particular, as above, bistable boundary 1502 indicates morphologies rendering layers equally stable in onion or vortex magnetic phases; bistable boundary 1504 indicates morphologies rendering layers equally stable in onion or perpendicular magnetic phases; and bistable boundary 1506 indicates morphologies rendering layers equally stable in perpendicular or vortex magnetic phases. Position 1541 lies on bistable boundary 1504, indicating that each of magnetic layers 1321, 1322, 1323, 1324, 1325, 1326 is equally stable in either a perpendicular magnetic phase, perpendicular to the plane of each magnetic layer, or an onion magnetic phase, within the plane of each magnetic layer. As also indicated by position 1541, magnetic data storage element 1310 provides the significant advantage of having relatively low outer radius and thickness per layer, meaning an overall relatively small volume, low mass, and high rate of heat loss per magnetic cell comprising such a magnetic element.

FIG. 13 also depicts different available magnetic configurations 1301, 1302, 1303, 1304, 1305, 1306 of the magnetic data storage element 1310. Each of the magnetic configurations includes one layer that is in an in-plane, onion magnetic phase, while each of the other layers is in a perpendicular, out-of-plane magnetic phase. The polarities of the perpendicular phase layers on a given side of the onion phase layer are parallel to each other in each of the magnetic configurations, while for those configurations in which the onion phase layer is not one of the outer layers 1321 or 1326, i.e. configurations 1302, 1303, 1304, and 1305, the perpendicular phase layers on one side of the onion phase layer are in the opposite polarity to the perpendicular phase layers on the other side of the onion phase layer.

In particular, in configuration 1301, magnetic layer 1321 is in the onion phase, while the other layers are all in the perpendicular phase with upward polarity; in configuration 1302, layer 1321 is in the perpendicular phase with downward polarity, layer 1322 is in the onion phase, and layers 1323-1326 are in the perpendicular phase, up polarity; in configuration 1303, layers 1321 and 1322 are in perpendicular phase, down polarity, layer 1323 is in the onion phase, and layers 1324-1326 are in the perpendicular phase, upward polarity; on so on for configurations 1304-1306 as depicted. The onion phase magnetic layers are each depicted with a particular polarity, though other polarities may also be used in different embodiments.

The single in-plane, onion-phase layer therefore functions as a "discrete domain wall", which is taken to refer to a magnetic layer that serves as a junction between two antiparallel magnetic layers, where the discrete domain wall layer has an orthogonal magnetization to the two antiparallel layers—in particular, the onion phase constitutes a magnetization that is orthogonal to the perpendicular magnetic phases on either side of it. This is analogous to a transverse domain wall in a continuous magnetic material, except that the domain wall has been discretized, and may be propagated through the magnetic element 1310 based on spin-momentum transfer inputs through either of terminals 1311, 1313. While the presently depicted embodiment includes only one discrete domain wall, various embodiments may also be configured for the capability to propagate any number of discrete domain walls per magnetic stack, enabling the magnetic stack, i.e. the magnetic data storage element, to function as a shift register memory. For example, a set of three adjacent magnetic layers within a magnetic stack may either include a discrete domain wall, or a set of three layers that lack a discrete domain wall and are instead in parallel, out-of-plane magnetization, such that the presence or absence of a discrete domain wall in a set of three adjacent magnetic layers is taken to represent either a "1" or a "0" of binary data. Each magnetic stack may therefore encode one bit of binary data per three magnetic layers in the stack, with the multiple bits susceptible to propagation, or shifting, through the stack in the manner shown for a single discrete domain wall in the presently depicted embodiment, enabling each stack to function as a shift register memory.

As depicted in graph 1400, the six different magnetic configurations depicted in FIG. 13 of magnetic data storage element 1310 provide six different levels of magnetoresistance 1301A, 1302A, 1303A, 1304A, 1305A, 1306A in response to a read/write signal. Compound magnetic data storage cell 1300 is therefore configured to yield any of at least six distinct magnetoresistance output levels, corresponding to six different stable magnetic configurations 1301, 1302, 1303, 1304, 1305, 1306 as depicted in FIG. 13, in response to spin-momentum transfer inputs via at least one of two terminals 1311, 1313. An illustrative example providing additional detail on how magnetic storage cell 1300 is used, is provided below with reference to FIGS. 16 and 17.

In still other illustrative embodiments, a data storage cell analogous to compound storage cell 1300 may hold any number of different magnetic layers. In yet other illustrative embodiments, the data storage cell may be configured to yield additional magnetic phases and orientations within large numbers of layers, such as by varying the radius, thickness, and optional inner radius for annularly formed layers in accordance with the functions disclosed herein, thereby yielding large numbers of different magnetoresistance levels for each single magnetic element.

FIGS. 16 and 17 depict different time-ordered sequences 1600, 1700 respectively of different magnetic configurations of magnetic data storage element 1310, illustrating the propagation of a discrete domain wall through the multi-layer stack of the magnetic element 1310. Both figures include simplified depictions of magnetic data storage element 1310 of FIG. 13 assuming different magnetic configurations over a period of time, with time being indicated on an x-axis proceeding from left to right. Intermediate layers are not depicted between the magnetic layers in FIGS. 16 and 17 for simplicity, though any type of intermediate, non-magnetic layers may also be disposed between each adjacent pair of magnetic layers.

In the propagation sequence 1600 represented in FIG. 16, the magnetic data storage element begins in magnetic configuration 1306B, with the lowest layer 1326B in the in-plane, onion magnetic phase, serving as the discrete domain wall, and the other magnetic layers 1321B-1325B all aligned in the perpendicular magnetic phase, parallel with each other in the downward polarity. This corresponds to the magnetic configuration 1306 depicted in FIG. 13. Then, a current is applied through the element, which may be applied through terminals 1311, 1313 as depicted in FIG. 13, with the conventional current direction being downward from the top, as indicated with the symbol "I" in FIG. 16, which corresponds to a flow of electrons directed upward from the bottom end of the element, as depicted with the symbol "e$^-$" in FIG. 16. When a current is driven through the stack having an upward electron flow, spin momentum is transferred from layer to layer, such that each layer experiences parallel-aligning torque from underlying layer(s) and antiparallel-aligning torque from overlying layer(s). The net effect is for the discrete wall to propagate upward, as shown with increasing time. The flow of electrons would therefore be sourced from terminal 1313 as depicted in FIG. 13, and come into contact first with magnetic layer 1326B as depicted in FIG. 16. This flow of electrons may act as a read and/or write signal and may constitute a spin-momentum transfer input, and propagates the discrete domain wall of the onion phase magnetization from one layer to another. In particular, the second time-ordered representation of the magnetic element, indicated as magnetic configuration 1305B, shows the magnetic phase being torqued from onion phase to upward-polarized perpendicular phase in lowest magnetic layer 1326B, while the magnetic layer 1325B is being torqued from downward-polarized perpendicular magnetization to onion-phase magnetic phase.

This same propagation of the magnetic phase transitions continues likewise in magnetic configurations 1304B, 1303B, 1302B, and 1301B as depicted in FIG. 16, as the spin-momentum transfer signal persists and the discrete domain wall is further propagated through the stack of magnetic layers. While this is depicted in FIG. 16 as continuing until the discrete domain wall of the onion magnetic phase is propagated all the way through the magnetic stack until it occupies the uppermost magnetic layer 1321B in magnetic configuration 1301B, the transfer signal may also be stopped at any intermediate time, when the magnetic element is in any of the magnetic configurations depicted, and it will then stably retain that magnetic configuration. Additionally, although six magnetic layers are depicted in the present illustrative embodiment, any number of magnetic layers may be used in other embodiments. The encoding of the magnetic configurations depicted in FIG. 16 therefore constitutes a discretizing or digitizing of a magnetic domain wall through an unlimited number of magnetic layers in a single compound magnetic data storage cell, therefore enabling that single compound cell to store a potentially unlimited amount of data, with the only practical limits given by design considerations of the speed of encoding and reading data through multiple layers per cell as balanced against multiple cells.

FIG. 17 depicts propagation sequence 1700 which corresponds to propagation sequence 1600 except with the direction of the signal through the magnetic element reversed. FIG. 17 therefore depicts an initial magnetic configuration 1301C with the in-plane magnetic phase occupying the uppermost magnetic layer 1321C, while the magnetic configurations 1302C-1306C represent the effects of a spin-momentum transfer signal sourced from a terminal in contact with the uppermost layer 1321C, which propagates the discrete domain wall, in the form of the in-plane phase, downward through layers 1322C-1326C, as a function of the amount of time (or other variables acting over time) that the signal is directed into the magnetic element. The magnetic cell is therefore enabled to receive any duration of signal through either end of the magnetic element, driving the discrete domain wall from any layer within the element to any other layer, thereby encoding multiple bits of information within the single magnetic element.

Figure 18:
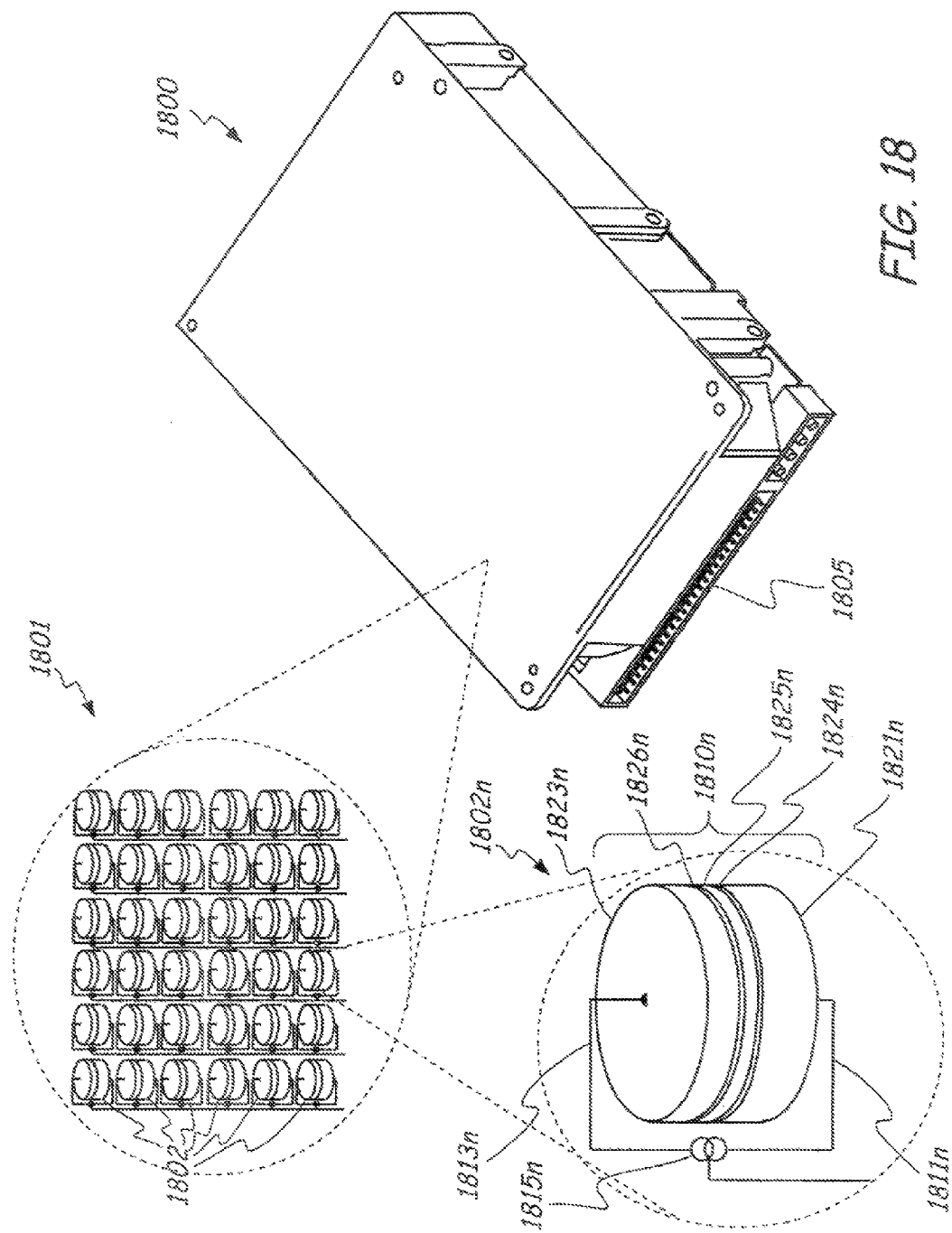
FIG. 18 depicts a data storage system, in accordance with another illustrative example.

FIG. 18 depicts a data storage system 1800, in accordance with another illustrative example. Data storage system 1800 includes a plurality of magnetic data storage cells, such as the illustrative sample 1801 of data storage cells 1802 shown in a magnified internal view from within data storage system 1800. The illustrative sample 1801 of data storage cells 1802 is not represented to scale, and various embodiments of data storage systems may include any number, potentially up through the millions, billions, trillions, or far more, of operably connected compound magnetic data storage cells. And while data storage system 1800 is depicted as a single device in the illustrative example of FIG. 18, other embodiments of data storage systems may include any number of networked or otherwise connected data storage devices, and may include a variety of different types of devices including some comprising compound magnetic data storage cells and others not, distributed over any volume of space. While the array of data storage cells 1802 depicted in sample 1801 with operable signal lines connected to all the terminals of the cells, this depiction is simplified, and any operable design for sending signals to and receiving signals from the individual magnetic cells may be employed in different embodiments.

Magnetic data storage cells 1802 contained within data storage system 1800 include representative magnetic cell 1802$n$, which is depicted in a separate and further magnified view. Representative magnetic data storage cell 1802$n$ includes first terminal 1811$n$, second terminal 1813$n$, and axially aligned magnetic element 1810$n$ that includes three substantially cylindrical magnetic layers 1821$n$, 1825$n$, and 1823$n$, along with intermediate, non-magnetic layers 1824$n$, 1826$n$ positioned between the adjacent pairs of magnetic layers.

Figure 19:
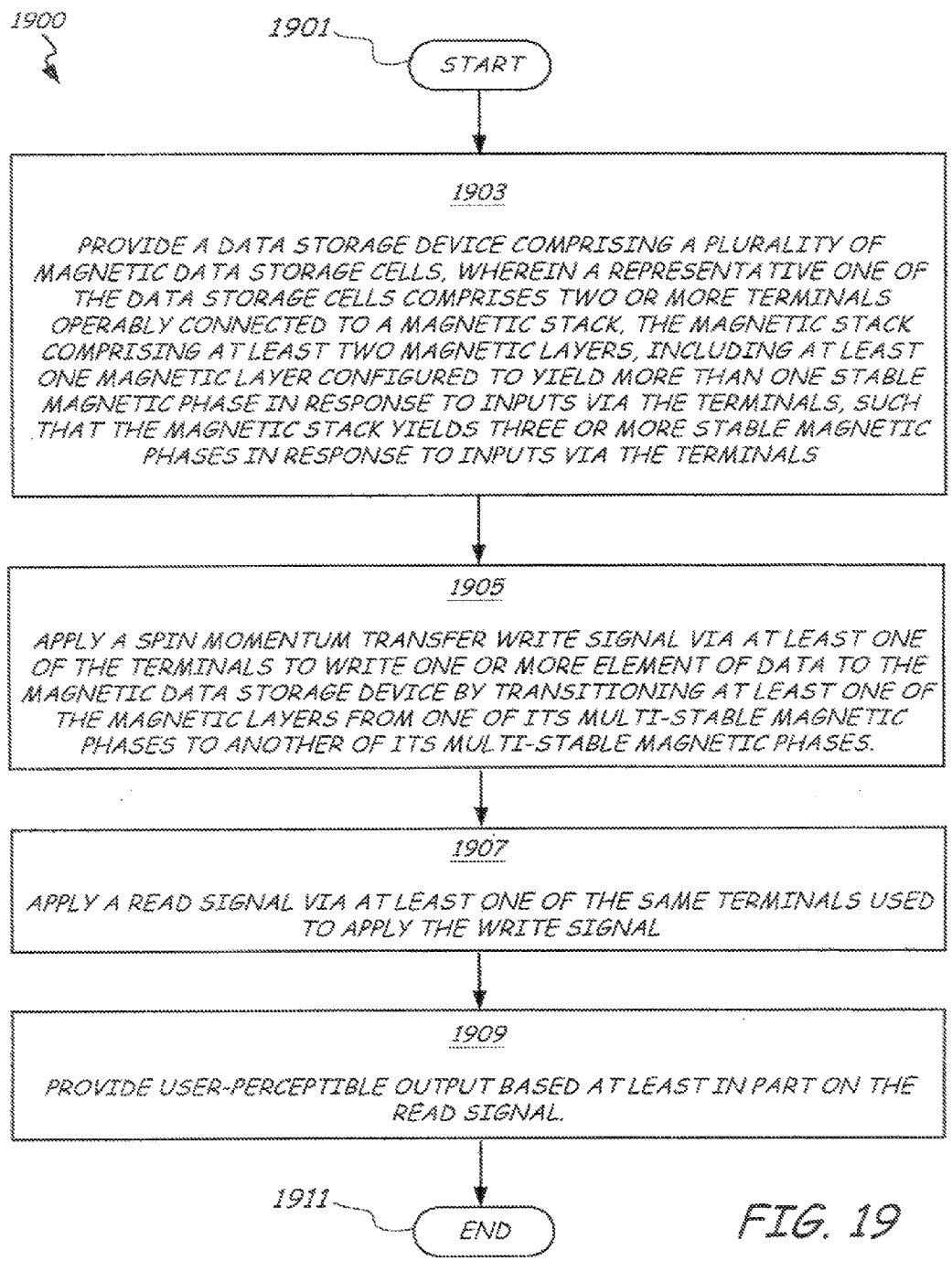
FIG. 19 depicts a method, in accordance with an illustrative example.

FIG. 19 depicts a method 1900 of recording data with compound magnetic data storage cells such as those described above, and that use the magnetic data storage elements described above, in accordance with an illustrative example, similar to the techniques described above. Method 1900 starts at step 1901 and includes step 1903, of providing a data storage system comprising a plurality of magnetic data storage cells, wherein a representative one of the data storage cells comprises two or more terminals operably connected to a magnetic stack, the magnetic stack comprising at least two magnetic layers, including at least one magnetic layer configured to yield more than one stable magnetic phase in response to inputs via the terminals, such that the magnetic stack yields three or more stable magnetic phases in response to inputs via the terminals. Method 1900 further includes step 1905 of applying a spin momentum transfer write signal via at least one of the terminals to write one or more element of data to the magnetic data storage system by transitioning at least one of the magnetic layers from one of its multi-stable magnetic phases to another of its multi-stable magnetic phases.

The steps above are sufficient to write data to the magnetic cells. Method 1900 may further include subsequent steps of reading data, as indicated by the dotted-line boxes for the later, optional data reading steps. Method 1900 may include step 1907, of applying a read signal via at least one of the same terminals used to apply the write signal, and step 1909, of providing user-perceptible output based at least in part on the read signal. Such user-perceptible output may be in any perceptible or otherwise tangible form, such as appearance on a visual monitor, printout of a hard copy, audio signals from a voice user interface or other audio output format, tactile outputs, data signals that are transmitted between applications or network nodes and ultimately incorporated in a subsequent user output, and so forth.

It is to be understood that even though numerous characteristics and advantages of various aspects of the present disclosure have been set forth in the foregoing description, together with details of the structure and function of various configurations of the disclosure, this disclosure is illustrative only, and changes may be made in details, including in matters of structure and arrangement of parts within the principles of the present disclosure to the full extent indicated by the broad general meaning of the terms in which the appended claims are expressed. For example, while magnetic layers and magnetic elements are depicted in the figures in a cylindrical form and of identical outer radius, various layers may be used that are of varying radii relative to each other, and of varying morphologies, particularly of morphologies that are more efficient or are inherent for the underlying crystal lattices of the materials used, particularly as storage cell size becomes ever smaller in subsequent iterations of development. As another example, while the examples discussed above make particular mention of cylindrically, one-dimensionally stacked magnetic layers in either the vortex or onion phase, other magnetic cells may be used in which various layers are stacked or arranged adjacent to each other in any arrangement, in multiple dimensions, and in which layers are used that are also fixed in the barrel phase, that are bi-stable in the vortex and barrel or onion and barrel phases, or that are tri-stable in all three phases. As yet another example, a data storage cell or data storage system of the present disclosure may be used in association with any technology for the storage and/or manipulation of data, including those involving magnetoresistance, giant magnetoresistance, colossal magnetoresistance, flash memory, optics, magneto-optics, photonics, spintronics, holography, and any other technology. In addition, the present disclosure is not limited to systems for storage or manipulation of data, but may also involve any technology involved with spin-torque magnetic manipulation.

What is claimed is:

1. A magnetic data storage cell, comprising:
a magnetic data storage element configured to yield any of at least three distinct magnetoresistance output levels, corresponding to stable magnetic configurations, in response to spin-momentum transfer input.

2. The magnetic data storage cell of claim 1, wherein the data storage element comprises at least two magnetic layers separated by an intermediate non-magnetic layer and configured to respond to different inputs by yielding:
a first stable magnetic configuration in which the two magnetic layers are magnetized in antiparallel magnetic states in a first magnetic phase;
a second stable magnetic configuration in which one of the magnetic layers is magnetized in the first magnetic phase and one of the magnetic layers is magnetized in a second magnetic phase; and
a third stable magnetic configuration in which the two magnetic layers are magnetized in parallel magnetic states in the first magnetic phase.

3. The magnetic data storage cell of claim 2, in which a first one of the magnetic layers is formed as a solid body, and a second one of the magnetic layers is formed as an annular body.

4. The magnetic data storage cell of claim 3, in which the first magnetic phase is cylindrical and the second magnetic phase is diametrical, and the magnetic layer formed in the annular body is magnetized in the diametrical magnetic phase associated with the second stable magnetic configuration.

5. The magnetic data storage cell of claim 1, wherein the data storage element comprises at least two magnetic layers separated by an intermediate non-magnetic layer and configured to respond to different inputs by yielding:
a first stable magnetic configuration in which the two magnetic layers are magnetized in antiparallel diametrical magnetic states;
a second stable magnetic configuration in which one of the magnetic layers is magnetized in a diametrical magnetic state and one of the magnetic layers is magnetized in a cylindrical magnetic state; and
a third stable magnetic configuration in which the two magnetic layers are magnetized in parallel diametrical magnetic states.

6. The magnetic data storage cell of claim 5, in which a first one of the magnetic layers is formed as a solid body, and a second one of the magnetic layers is formed as an annular body, and the magnetic layer formed in the annular body is the magnetic layer that is magnetized in the cylindrical magnetic state associated with the second stable magnetic configuration.

7. The magnetic data storage cell of claim 1, wherein the data storage element comprises three magnetic layers, configured to respond to different inputs by yielding four distinct magnetoresistance output levels, corresponding to stable magnetic configurations, wherein two of the layers are fixed and one of the layers is free.

8. The magnetic data storage cell of claim 7, wherein the four stable magnetic configurations comprise:
a first stable magnetic configuration in which two of the magnetic layers are magnetized in antiparallel magnetic states in a first magnetic phase;
a second stable magnetic configuration in which two of the magnetic layers are magnetized in antiparallel magnetic states in the second magnetic phase;
a third stable magnetic configuration in which two of the magnetic layers are magnetized in parallel magnetic states in the first magnetic phase; and
a fourth stable magnetic configuration in which two of the magnetic layers are magnetized in parallel magnetic states in the second magnetic phase.

9. The magnetic data storage cell of claim 1, wherein the data storage element comprises at least two magnetic layers separated by an intermediate non-magnetic layer and at least one of the magnetic layers is configured to be substantially equally stable in either of at least two different magnetic phases.

10. The magnetic data storage cell of claim 1, wherein the data storage element comprises three or more magnetic layers, disposed in two or more adjacent pairs in a stack of layers, wherein each of the layers is configured to be equally magnetically stable in either a perpendicular or an in-plane magnetic phase.

11. The magnetic data storage cell of claim 10, wherein the magnetic layers are configured to propagate one or more discrete domain walls from one layer to another in response to the spin-momentum transfer inputs, enabling discrete domain walls to be shifted through the data storage element.

12. The magnetic data storage cell of claim 1, wherein the data storage element comprises at least two magnetic layers composed of different ferromagnetic materials.

13. The magnetic data storage cell of claim 1, wherein the data storage element comprises two or more magnetic layers, and at least one of the magnetic layers is maintained in a fixed magnetic phase by pinning it in that phase.

14. The magnetic data storage cell of claim 1, wherein the data storage element comprises three magnetic layers composed of one or more magnetic materials from a group consisting of: iron, cobalt, nickel, Permalloy, and Heusler alloys.

15. The magnetic data storage cell of claim 1, wherein the data storage element comprises at least two magnetic layers separated by an intermediate non-magnetic layer wherein the intermediate layer comprises an insulating barrier configured for quantum tunneling magnetoresistance.

16. The magnetic data storage cell of claim 1, wherein the data storage element comprises at least two magnetic layers separated by an intermediate non-magnetic layer wherein the intermediate layer comprises a metal layer configured for giant magnetoresistance.

* * * * *